United States Patent [19]

Lockard et al.

[11] Patent Number: 5,762,716

[45] Date of Patent: Jun. 9, 1998

[54] METHODS FOR WIPING A METAL CONTAMINATED SURFACE WITH A WATER SOLUBLE FABRIC

[75] Inventors: Donald G. Lockard, East Greenwich; Karl S. Seelig, Jamestown, both of R.I.

[73] Assignees: American Iron & Metal Company, Inc., Montreal, Canada; La Compagnie Americanine de Fer et Metaux, Inc., Quebec, Canada

[21] Appl. No.: 781,009

[22] Filed: Jan. 9, 1997

[51] Int. Cl.$^6$ ............................... B08B 7/00; B08B 7/04
[52] U.S. Cl. .................. 134/2; 134/6; 134/7; 134/10; 134/13; 134/42; 15/104.93
[58] Field of Search ................... 134/6, 7, 10, 13, 134/42, 2; 15/104.93, 104.94, 209.1, 210.1

[56] References Cited

U.S. PATENT DOCUMENTS

| | | | |
|---|---|---|---|
| 3,413,229 | 11/1968 | Biano et al. | 510/296 |
| 4,144,612 | 3/1979 | Yamaguchi | 15/208 |
| 4,343,133 | 8/1982 | Daniels et al. | 53/431 |
| 5,207,837 | 5/1993 | Honeycutt | 134/42 |
| 5,268,222 | 12/1993 | Honeycutt | 428/224 |
| 5,317,071 | 5/1994 | Honeycutt | 527/305 |
| 5,352,368 | 10/1994 | Honeycutt | 210/749 |
| 5,417,977 | 5/1995 | Honeycutt | 424/443 |
| 5,434,331 | 7/1995 | Barkatt et al. | 588/1 |
| 5,547,601 | 8/1996 | Volpe | 15/104.93 |
| 5,639,532 | 6/1997 | Wells | 428/95 |

FOREIGN PATENT DOCUMENTS

WO 96/04077  2/1996  WIPO.

OTHER PUBLICATIONS

Honeycutt, T.W. (1996). "Degradable Polymer Waste Reduction Technology", *CleanRooms '96 East Proceedings*, pp. 437–443.

Literature from http://interactive 4.wsj.com site, Jul. 31, 1996.

*Primary Examiner*—Jill Warden
*Assistant Examiner*—Saeed Chaudhry
*Attorney, Agent, or Firm*—Testa, Hurwitz & Thibeault LLP

[57] ABSTRACT

The invention provides methods for wiping metal contaminants from a surface, especially a circuit board assembly, or other surface exposed to solder paste, and solubilizing the wiping material. Metal contaminants are then easily and safely removed from the solubilized material for safe recycling and/or disposal.

5 Claims, No Drawings

METHODS FOR WIPING A METAL CONTAMINATED SURFACE WITH A WATER SOLUBLE FABRIC

FIELD OF THE INVENTION

The present invention generally relates to the environmentally safe removal and treatment of heavy metal waste products generated in the process of electronic circuit board assembly.

BACKGROUND OF THE INVENTION

Heavy metals, such as lead, are used in the manufacture of a variety of commercial and industrial products, and are highly toxic. For example, lead exposure adversely affects many bodily enzyme systems, in particular heme synthesis. Chronic lead poisoning can result in gastrointestinal disturbances, anemia, motor weakness, muscle paralysis, and nephropathy. Lead and other heavy metal waste products are therefore designated as hazardous waste. Disposal of hazardous waste in a manner that is safe and environmentally compliant has been problematic. For example, disposal of hazardous waste in standard landfills has been banned by the U.S. Environmental Protection Agency (EPA), and the use of landfills especially designed to contain hazardous waste is increasing in disfavor because of the environmental hazards created by such landfills.

A significant amount of toxic lead waste is generated in electronic assembly plants, the majority of which is a by-product of the surface mount assembly process in which circuit boards are constructed. The most common method for soldering electronic components (e.g., capacitors and resistors) to a printed circuit board is to use a stencil printing process in order to apply a tin lead solder paste to the circuit board. Stencils used in the printing process may comprise a metal mesh or other screen with selective openings. The solder paste is typically a blend of solder alloy powder, normally containing lead, and flux medium. The solder paste is typically applied to the circuit board in a screen printing process in which a roller pushes the solder paste over the stencil and through openings in the stencil, causing the paste to come in contact with the circuit board. Once the solder paste is applied to the circuit board, the desired electronic components are placed on the circuit board and the entire assembly is heated. The various electronic components are then bonded to the circuit board. The applied solder may secure conducting wire joining the electronic components or may itself provide conductance between soldered components.

Periodic cleaning of the stencils is required due, in part, to accumulation of solder paste on the stencil. Some stencil printers have a wiping feature that cleans stencils automatically at programmed intervals. In such printers, rolls of a wiping material are placed on a spool and the material is then drawn over the soiled stencil to remove the solder paste and re-rolled onto another spool. A second method of wiping a stencil consists of an automated system, similar to the one described above, wherein a vacuum is applied during the wiping process. Other circuit board printers require hand wiping.

Cleaning methods described in the art generate wiping materials contaminated with lead solder which must be disposed of as hazardous waste. Typically, lead waste is disposed of at an approved landfill site, where there is sufficient clay filtration and appropriate drainage to prevent the lead from leeching into the groundwater. The cost of disposing of lead-bearing waste at an approved landfill is considerable. Moreover, as the areas available for hazardous waste disposal become more scarce, the cost of disposal rises.

The above described circuit board cleaning process and other processes in which solder paste is used require that assembly workers be exposed to lead—whether it be solid, particulate, or in the form of an aerosol. Such workers are expected to develop blood lead concentrations averaging 0.60 mg/L (Williams et al. (1969) *Brit. J Ind. Med.* 26:202–216), well above the normal range of a healthy suburban adult (0.07–0.22 mg/L; Manton et al. (1977) *Arch. Env. Health* 32:149–159). Further, a study on blood levels in children of industrially exposed fathers revealed that 42% had blood lead levels in excess of 0.30 mg/L and 11% had blood lead levels which exceeded 0.8 mg/L, which are 3–80 fold above normal blood lead levels for children (Baker et al. (1977) *New Eng. J Med.* 296:260–261). Thus protective garments are required to minimize lead exposure to workers and the disposal of such garments adds to the environmental problems created by accumulation of heavy metal waste.

Fabrics or garments that are soluble in a solvent (e.g. water) at temperatures of about 30° C. have been used in the health care industry to dispose of biohazardous waste (See, e.g. U.S. Pat. Nos. 5,268,222 and 5,207, 837 reporting the use of gowns, pillows, face masks, etc.). However, the practical and environmental benefits of using soluble fabric for waste disposal in the electronics industry has not been recognized.

Therefore, there is a need in the art for methods of removing metal waste from stencils or other electronics-related components (e.g. spatulas and other means for applying solder) and for treating metal-contaminated garments used in the electronics industry. Such methods are provided by the invention.

SUMMARY OF THE INVENTION

It has now been appreciated that waste material, especially metallic waste, that accumulates on a surface, such as contained in an electronics assembly (e.g., printing screens, stencils, circuit boards, and other electronic circuitry devices), is efficiently and safely removed by wiping the equipment with a material (e.g., a fabric) that is soluble in solvents at temperatures above about 30° C. After wiping, the material is dissolved or solubilized in water or another appropriate solvent by heating and agitation. Waste may then be safely extracted and disposed of in an environmentally-acceptable manner.

Methods of the invention are particularly useful for cleaning hazardous metal waste from an electronic printing stencil, or other apparatus on which metal-bearing solder paste or other metallized materials are used. For example, lead waste is generated in surface mount assembly processes in the electronics industry through the use of lead-bearing solder paste on circuit board printing stencils. In methods of the invention, such waste is removed by wiping a contaminated stencil with a material dissolvable in a solvent at a defined temperature. Preferred solvents are water, isopropyl alcohol, a water/isopropyl alcohol mixture, butyl carbitol, and a butyl carbitol/isopropyl alcohol mixture. However, other appropriate solvents are known to the skilled artisan. The wiping material may be in the form of a fabric, such as a cloth, a sponge, a gauze or other material. Preferably, the soluble wiping material comprises a substance that adsorbs, absorbs, or otherwise adheres heavy metal waste. A preferred wiping material is polyvinyl alcohol (PVA). Other preferred wiping materials comprise polyvinyl acetate, polymethyl vinyl ether, polyvinyl pyrrolidone, and polyethylene oxide. The wiping material is ideally one that is not degraded by cleaning solvents or by the solder paste itself. Once the stencil or other electronic assembly equipment is wiped with the material, the contaminated material is then exposed to an aqueous solution, at a temperature of greater than about 30° C. The solution is preferably agitated. In a preferred embodiment, the material, for example, a fabric, is soluble in temperatures greater than about 50° C. Also in a preferred embodiment, the material is soluble at temperatures greater than about 70° C. In a highly-preferred embodiment, the material is soluble in temperatures greater than about 90° C. Heating causes breakdown of the material. Metallic waste may then be extracted by, for example, filtration or centrifugation. The resulting waste water is then either treated (e.g. by an ion-exchange process) to comply with waste disposal regulations, or is disposed of as environmentally nonhazardous waste. The extracted metals may be recycled for use in solder paste or other materials, or may be disposed of under appropriate regulations for metal disposal.

Methods of the invention constitute an improvement in the treatment of metallic waste, especially heavy metal waste, by concentrating the waste on a soluble material capable of absorbing, adsorbing or otherwise adhering solder paste or other media containing metallic waste. The material is then processed by dissolving it in water or any other medium in which the material is soluble at high temperature but not at a lower temperature, for example, room temperature. Non-hazardous solvent may then be separated from metal contaminants. Accordingly, in a preferred embodiment, methods of the invention comprise the step of wiping a contaminated surface with a soluble material, thereby to remove metallic waste (such as heavy metals). Also in a preferred embodiment, methods of the invention further comprise the steps of dissolving the material in an appropriate solvent and extracting metal waste from the solution produced thereby.

A surface to be cleaned by methods of the invention may be any surface on which metal or metallic waste is deposited. Especially preferred surfaces are electronics assembly surfaces, such as stencils for preparing printed circuits. Metals are typically deposited in the form of a paste or solder compound, which may comprise solder alloy powder and flux medium. In a preferred method of the invention, material used to wipe contaminated surfaces is soluble in water heated to a temperature of greater than about 30° C. Wiping material for use in methods of the invention may be any material, especially a bonded fabric, capable of dissolving in a liquid medium, preferably water. Such material preferably comprises, but is not limited to polyvinyl alcohol or polyvinyl alcohol resin. Polyvinyl alcohol for use in methods of the invention may be in the form of a homopolymer (preferably a dried homopolymer), or copolymer, and may be either crosslinked or uncrosslinked, but is preferably uncrosslinked. Polyvinyl alcohol is preferably crystallized by post drawing or heat annealing prior to its use in fabric or other material. In addition, the wiping material may be a thermoplastic resin, modified PVA or other composite resin. For example, PVA may be admixed with pectin or another substance that aids solubilization. Moreover, material for use in the invention is preferably insoluble at room temperature or lower when exposed to a standard cleaning solvent, such as isopropyl alcohol or glycols. Wiping material may be cut to size for a particular application, such as hand wiping, or for placement on drums or spools for automated wiping. Additionally, material may be constructed from a thermoplastic polymer, an example of which is Orex (Isolyser Co., Norcross Ga.). Soluble fabrics used to clean electronics equipment may also be fabricated into protective garments, e.g., gloves, face masks, smocks or shoe coverings. Such garments also require environmentally-sound disposal and are worn by workers exposed to heavy metals.

Surfaces that may be treated using methods of the invention include electronics assembly, such as circuit boards, electronic printing screens, circuit board printing apparatus, spatulas, rollers, and other devices for applying solder paste, garments, and any other materials that come into contact with metal-containing compositions, such as solder paste. Other aspects and advantages of the invention will become apparent upon consideration of the following detailed description thereof.

DETAILED DESCRIPTION OF THE INVENTION

It has now been recognized that the problem of metal disposal in the electronics industry may be reduced or eliminated at the point of generation by treating contaminated substances so as to isolate lead and other metals. The invention provides methods in which a wiping material, such as a polymer fabric, e.g. one comprising polyvinyl alcohol (PVA) fibers, is used to clean materials bearing heavy metals. Polyvinyl alcohol is a non-hazardous, non-toxic, biodegradable material that is generally water soluble at temperatures above about 30° C., and generally insoluble at temperatures below about 30° C. Such materials are useful for wiping lead solder waste from, e.g., circuit boards. Soiled PVA is then exposed to an agitating hot water bath at high temperature. Temperatures are preferably above about 60° C. and more preferably above about 90° C. In preferred methods of the invention, lead-contaminated PVA fabric is solubilized, producing a liquid material or semi-liquid from which solid metal waste is isolated by, for example, filtration. The remaining liquid components are then filtered or otherwise decontaminated (e.g. by an ion exchange process) for safe disposal through the municipal sewer system. Residual solids, including metals, are further treated according to accepted environment standards. Solvents for solubilizing wiping material may optionally contain a surfactant or other additive to aid in dissolution of the wiping material and/or contaminants adhering to the wiping material. These and further objects of the invention will be more readily appreciated upon consideration of the following disclosure.

It is apparent to one skilled in the art that wiping material for use in methods of the invention may be comprised of one or more soluble materials such as, for example, polyvinyl alcohol, polyvinyl acetate, polymethyl vinyl ether, polyvinyl pyrrolidone, and polyethylene oxide. Further, the solvent used in methods of the present invention may comprise one or more solvents capable of dissolving the wiping material within a certain temperature range. It is preferred that the wiping material is soluble at temperatures above about 30° C. and insoluble at temperatures below about 30° C. A preferred solvent is water. Other preferred solvents are those that are not hazardous to the environment or to workers practicing the invention. While not intending to be limited, below is described one preferred wiping material and its use in methods of the invention. It is apparent to the skilled artisan that other wiping materials may be used in methods of the invention as long as such materials adhere metallic waste and are insoluble in a solvent at room temperature and soluble in the solvent at a higher temperature as indicated above.

Polyvinyl Alcohol (PVA) Materials

In one embodiment, the wiping material used in the present invention is formed from a yarn comprising a plurality of fibers, each comprising PVA. Polyvinyl alcohol is a nontoxic, synthetic polymer that is produced by alkali or acidic hydrolysis of polyvinyl acetate. The vinyl acetate monomer is produced, for example, by reacting either acetylene and acetic acid or ethylene, acetic acid and oxygen. Other methods are known in the art for producing polyvinyl alcohols.

Polyvinyl alcohol is preferably manufactured as a water soluble or insoluble resin. Water soluble resins of PVA can be hot and cold water soluble or hot water soluble only. The temperature at which PVA dissolves is controlled by changing its degree of hydrolysis, polymer crystallization, and extent of polymerization. The PVA resin used in the present invention is intended to have a general range of hydrolysis of greater than about 90% and preferably about 99%, and less than 1.0% sodium acetate, less than 0.20% methyl alcohol with a preferred degree of polymerization about 2000. The degree of polymerization may be as low as about 1300, however.

Polyvinyl alcohol fibers are preferably formed by dissolving suitable hot water soluble polyvinyl acetate resin in deionized or distilled water to a 5% to 15% by weight percent of solids, thereby creating a "dope". The dope is then allowed to stand for a considerable period of time, for example two weeks, for gel setting. The dope is preferably free of microbial organisms, as PVA is subject to microbial degradation when in solution (i.e., it is biodegradable). This can be accomplished either through ultrafiltration, heating, or other means well known to those of ordinary skill in the art. Such techniques include the addition of anti-microbials, such as ester phenolic derivatives (e.g., salicylic or benzoic esters).

Once the PVA resin has been gel set, it is then filtered and forced through a spinneret and into a saturated solution of sodium sulfate wherein each fiber is coagulated into a range of from about 6 deniers to about 10 deniers. The resulting fiber is subjected to a drawing between about a 2:1 and about a 5:1 ratio, with 4:1 ratio preferred, and heat annealed at the glass transition point to produce hot water soluble fibers (which reduces cold-water solubility). The degree of crystallinity and the degree of orientation for the treated and stretched PVA fibers are preferably approximately 0.70 and 0.52, respectively. The fibers so produced are then either chopped into a staple between approximately 1 inch to approximately 2 inches long or formed into tow bundles which can then be stretch broken with a fiber length of from about 1 inch to about 6 inches. These fibers are then formed into a yarn either by conventional cotton or wool spinning methods, or spun directly from the stretch broken tow. A preferred yarn size is between about 60 singles and about 0.5 singles, with up to four plies of each of these yarns. Yarns can be spun in the Z or S direction with a weaving twist multiple between about 3 and about 6 with 3.5 to 4.0 twist multiple preferred.

In a preferred embodiment, PVA fabric is formed by weaving. For example, yarns comprising PVA are intermingled in a perpendicular fashion or are woven, single knit, double knit, interlocked, warped knit, or crocheted, as desired. The yarn may be colored, if desired. If colored, the yarn should be dope dyed in the resin solution. Useful pigments are those that are insoluble in water in order to produce the highest quality light sublimentation and mark-off resistance. These products are formed into fabrics, de-sized as necessary and cut, sewn and washed at up to 100° C. before further processing. Also in a preferred embodiment yarn formation is bypassed to produce a non-woven fabric directly from the fiber. Such non-woven fabrics are commonly referred to as air laid, wet laid, hydroentangled, thermobonded, or chemical bonded.

Polyvinyl alcohol fabrics are preferably from about 1 mil to about 6 mils thick and more preferably from about 1 mil to about 3 mils thick and most preferably approximately 1.5 mils thick. Suitable non-woven fabric or sheets are approximately from about 15 g/yd$^2$ to about 200 g/yd$^2$ in weight and more preferably from about 20 g/yd$^2$ to about 80 g/yd$^2$ in weight and most preferably from about 25 g/yd$^2$ to about 80 g/yd$^2$ in weight. Alternatively, the fabric used to practice the invention may be a composite fabric comprising a first reusable component and a second "barrier" component that is disposable, dissolvable and re-cyclable. The first reusable component is substantially insoluble in aqueous solutions such that the first component is capable of being repeatedly laundered in hot surfactant-loaded aqueous solutions without substantial loss of component integrity. The second component comprises a polymer fabric of PVA which is water soluble at temperatures above about 30° C. and insoluble at temperatures below about 30° C. The barrier fabric or second component can be "combined" with the first or reusable component in any of a number of ways. For example, the hot water soluble barrier fabric can be cast in sheets or thermobonded, stitched or even joined by adhesive to the reusable fabric. Such an adhesive is ideally soluble in solvents above about 30° C. to facilitate the reusability of the first component. Composite PVA-containing fabrics are described in U.S. Pat. No. 5,268,222, incorporated by reference herein.

Polyvinyl alcohol used in the above described fabrics may or may not contain acetyl groups, and may be crosslinked or uncrosslinked. Preferably, the cloth is composed of PVA homopolymer that has been highly crystallized by post drawing or heat annealing. Ideal for use in the present invention is a highly crystallized, totally saponified PVA. Commercially, PVA is sold under the trademark Vinex 1003™ (Air Products). Useful fibers are typically from about 0.5 denier to about 5.0 denier and are preferably from about 1.0 denier to about 2.0 denier and most preferably sized from about 1.2 denier to about 1.5 denier. A commercially available product for use in practicing the present invention is either type T-B (VEE 1290) or type T-5 (VpB 101) PVA (Kuralon).

Material used in the present invention is preferably lint free, so that fiber particles are not left behind on the stencil or other electronic assembly surface. Ideally, the material is a bonded cloth such as OREX (Isolyser Co. Inc., Norcross, Ga.) or polyvinyl alcohol fibers (Fiber Science, Inc., Palm Bay, Fla.). OREX may be used dry or soaked in an appropriate solvent (e.g. water). Therefore, cloth material for use in the invention preferably is capable of being exposed to and absorbing or adsorbing, without degradation, cleaning solvents, such as water, isopropyl alcohol, glycols, alcohols, and other solvents. These solvents may be sprayed on a contaminated surface, e.g., a stencil, or on the cloth to improve the cleaning action of the cloth. Consequently, the cloth should be insoluble in the above solvents at wiping temperatures, e.g., room temperature. Electronics manufacturers may also be supplied with cloth in the size and shape to best suit their particular stencil cleaning application. The forms of the cloth are up to about one sixteenth of an inch thick and up to about 18 inches square. Rolls of cloth, as described above, are up to about 24 inches wide and up to about 50 feet in length.

Wiping materials for use in methods of the invention may comprise products other than PVA that can be disposed of in an environmentally-compliant manner. An embodiment of the invention embraces the use of materials (e.g., comprising PVA) to contain, dispense, and transport lead solder paste. In one aspect, a container for heavy metal waste is entirely composed of, for example, PVA. In another aspect, the container comprises one or more inner layers composed of, for example, PVA which are in direct contact with the contaminant, and one or more outer layers composed of a reusable substance that does not come into contact with the contaminant. Such packaging includes, but is not limited to, jars, cartridges, and syringes. For example, cartridges may be composed of cylindrical tubes containing solder paste with a nozzle on a first end, and wherein pressure is applied to a second end, causing the paste to dispense from the first end onto a stencil. Syringes may be used to dispense the solder paste onto the screen directly.

Example 1: Cleaning of an Electronic Stencil with PVA Fabric

A sample of a first cloth (fabric 1) comprising a white, non-woven PVA fabric and a second cloth (fabric 2) comprising a green, non-woven PVA were weighed and used to wipe solder paste (with a 90 percent by weight metal content) from a contaminated electronic stencil paste printer. The soiled cloths were weighed after adsorbing the solder paste and the samples were placed in a 500 ml glass beaker containing water at between 93° C. to 97° C. After agitating the solution for five to fifteen minutes, the solute was cooled and decanted away from the lead-containing solids. The solids were air dried for 1 hour and weighed to determine the percentage of recoverable lead. Table 1 shows the amount of lead solder waste recovered using this procedure. Recovery yields of lead solder ranged from 90%–130%. As the solder paste is composed of 90% lead alloy, the recovery values of over 90% were due to the presence of undissolved cloth, as demonstrated by the presence of polymer residue on the surface of the solution.

Fabric 1 remained stable at temperatures up to about 70°–75° C., but was prone to "gluing" (apparently due to swelling) at higher temperatures. The glued aggregates dissolved in water very slowly.

Fabric 2 was resistant to solubilization at room temperature in water or isopropanol. At temperatures around 85°–90° C. fabric 2 remained stable but began to disintegrate into small short fibers at higher temperature. At 93°–97° C. the fabric dissolved within 10–15 minutes and required a smaller volume of water to achieve complete dissolution. Fabric 2 was more resilient than fabric 1, suggesting that it had a preferred mechanical structure to fabric 1. Boiling of the lead contaminated fabrics created an undesirable polymer film on the solution surface and required an increased volume of water to achieve dissolution.

TABLE 1

Recovery of Metal

| Run | Sample | Paste | Recovery (to paste) | Water-to-fabric | Comments |
|---|---|---|---|---|---|
| 1 (fabric 1) | 3.2 g | 5.1 g | 130% | 100:2 | polymer residue |
| 2 (fabric 1) | 1.4 g | 12.7 g | 92% | 100:0.5 | OK |
| 3 (fabric 2) | 4.7 g | 12.7 g | 102% | 100:3 | polymer residue |
| 4 (fabric 2) | 2.8 g | 4.2 g | 90% | 100:1 | OK |

A single cloth comprised of 10 g of fabric 2, can absorb about 50 grams of lead solder paste, with a hot water recovery of about 45 grams solid.

Example 2: Comparison of Dyed and Non-Colored PVA Fabrics

Samples of white or green-dyed woven gauze or non-woven PVA fabric (Isolyser) were used to clean solder paste from a stencil machine after the fabric was soaked in isopropanol (IPA), butyl carbitol or tetrahydrofluoroacetic acid (THFA). After soaking fabric in one of each of the above solvents, the fabric was first examined visually at 1× or at 10× magnification. No major degradation of any of the solvent-soaked fabrics was observed. The fabrics were then used to wipe solder paste from a screen printer and the lead soiled wipes were then placed in 100 ml of water at 95° F. The woven gauze material was prone to snags due to its loose weave. Table 2 summarizes the manner by which the non-woven PVA fabrics decomposed in the above described process.

TABLE 2

Solubility of white and green-dyed non-woven PVA fabric

| Fabric | IPA | Butyl Carbitol | THFA |
|---|---|---|---|
| White non-woven | totally dissolved | totally dissolved | totally dissolved |
| Green non-woven | partially dissolved | partially dissolved | partially dissolved |

All four fabrics (white gauze, white non-woven, green gauze, green non-woven) were insoluble in the solvents at room temperature. The non-woven fabric however was able to absorb more solvent and was more durable in the wiping process than the gauze material. The white (non-dyed) fabric dissolved readily in hot water, regardless of the solvent in which it was presoaked, whereas the green-dyed fabric dissolved less readily than the white fabric in hot water. These results demonstrate that a non-woven PVA fabric is preferred over a gauze fabric and that the dyes used to prepare fabrics, or the dying process itself, may decrease fabric solubility and thus the effectiveness of the PVA fabric.

Additional advantages and aspects of the invention are apparent to the skilled artisan upon consideration of the foregoing. Accordingly, the invention is limited only by the scope of the appended claims.

What is claimed is:

1. A method for removing metallic waste from an electronics assembly, comprising the steps of:

wiping an electronics assembly with a water soluble fabric, thereby to remove metallic waste from said assembly; and agitating said fabric in an aqueous solution at a temperature greater than about 60° C.;

thereby solubilizing the fabric.

2. The method of claim 1, wherein said wiping step is automated.

3. The method of claim 1, wherein said electronics assembly is an electronic printing stencil.

4. The method of claim 1, further comprising the step of separating said metallic waste from said aqueous solution after said solubilizing step.

5. The method of claim 1, further comprising the step of pretreating said assembly with a cleaning solvent.

* * * * *